United States Patent [19]
Jeng et al.

[11] Patent Number: 5,243,493
[45] Date of Patent: Sep. 7, 1993

[54] FANLESS CONVECTION COOLING DESIGN FOR PERSONAL COMPUTERS

[75] Inventors: Jian-Dih Jeng, Miau; Fang-Jun Leu, Hsinchu, both of Taiwan

[73] Assignee: Industrial Technology Research Institute, Chutung, Hsinchu, Taiwan

[21] Appl. No.: 875,305

[22] Filed: Apr. 29, 1992

[51] Int. Cl.⁵ .............................................. H05K 7/20
[52] U.S. Cl. ..................................... 361/690; 361/679; 361/752; 361/814
[58] Field of Search ......................... 361/380, 383–384, 361/390, 391, 394–395, 412, 399, 413, 415, 428; 364/708

[56] References Cited

U.S. PATENT DOCUMENTS

| | | | |
|---|---|---|---|
| 3,857,044 | 12/1974 | Papoi et al. | 361/383 |
| 4,498,717 | 2/1985 | Reimer | 361/413 |
| 4,679,121 | 7/1987 | Schomers et al. | 361/413 |
| 4,680,425 | 7/1987 | Speraw | 361/390 |
| 4,716,493 | 12/1987 | Zelkowitz | 361/383 |
| 4,748,540 | 5/1988 | Henneberg et al. | 361/383 |
| 4,821,146 | 4/1989 | Behrens et al. | 361/399 |
| 4,980,848 | 12/1990 | Griffin et al. | 361/383 |
| 4,985,803 | 1/1991 | Pum et al. | 361/383 |
| 5,051,866 | 9/1991 | Osaka | 361/384 |
| 5,105,336 | 4/1992 | Jacoby et al. | 361/383 |

*Primary Examiner*—Gregory D. Thompson
*Attorney, Agent, or Firm*—George O. Saile

[57] ABSTRACT

An enclosure is described for housing a personal computer. The natural convection system of the present invention for dissipating heat generated by the electronic components of a personal computer consists of a housing defining a cavity containing the electronic components. The major heat-producing components, such as the power supply of the computer and power transistors, are positioned at the top front of the cavity. The components are attached to a heat sink. A typical computer has a master printed circuit board. Additional printed circuit boards are plugged into the master printed circuit board. Further additional printed circuit boards may be added at any time to enhance the functionality of the computer. Therefore, plugging in additional printed circuit boards should be a simple operation. In the present invention, the master printed circuit board is attached to a side in the rear of the cavity. Other printed circuit boards are attached vertically and perpendicularly to the master printed circuit board. An access panel above the printed circuit boards opens to allow easy access to the printed circuit boards ends with connectors and room for cable connectors.

18 Claims, 5 Drawing Sheets

FANLESS CONVECTION COOLING DESIGN FOR PERSONAL COMPUTERS

BACKGROUND OF THE INVENTION (1) Field of the Invention

The invention relates to a structure for housing and cooling the electronic components of a personal computer. More particularly, this invention relates to a cooling system for personal computers by natural convection rather than by mechanical air handling equipment.

(2) Description of the Prior Art

In the design of structures for housing power-carrying electronic components, dissipation of heat generated by the electronic components housed within the enclosure is a major design consideration. A design providing inadequate heat dissipation can lead to heat buildup which can cause component failure.

To prevent heat buildup, enclosures for electronic equipment are typically vented on the bottom and top of the enclosure to provide an air inlet and outlet, respectively. A fan is used to force air through the enclosure thereby exhausting the heated air. Such an enclosure is described in U.S. Pat. No. 4,739,445 assigned to Microscience. Other designs use a heat exchanger rather than a fan to cool the heated air. Such a design is described in U.S. Pat. No. 4,535,386 by Sydney W. Frey, Jr. et al.

The noise caused by a fan is a disadvantage in some environments, as is the dependence on mechanical devices subject to breakdown. While heat exchangers eliminate the aforementioned disadvantages of mechanically cooled enclosures, they are complicated.

Therefore, it is a primary objective of this invention to provide a simple and effective fanless convection cooling system for electronic components.

SUMMARY OF THE INVENTION

In accordance with the present invention, an enclosure is described for housing a personal computer. The natural convection system of the present invention for dissipating heat generated by the electronic components of a personal computer consists of a housing defining a cavity containing the electronic components. The major heat-producing components, such as the power supply of the computer and power transistors, are positioned at the top front of the cavity. The components are attached to a heat sink. A typical computer has a master printed circuit board. Additional printed circuit boards are plugged into the master printed circuit board. Further additional printed circuit boards may be added at any time to enhance the functionality of the computer. Therefore, plugging in additional printed circuit boards should be a simple operation. In the present invention, the master printed circuit board is attached to a side in the rear of the cavity. Other printed circuit boards are attached vertically and perpendicularly to the master printed circuit board. An access panel above the printed circuit boards opens to allow easy access to the printed circuit boards ends with connectors and room for cable connectors.

In conventional personal computer systems, the add-on boards are attached horizontally and perpendicularly to the master printed circuit board. Due to this arrangement of the boards, there may exist stagnation regions on the master printed circuit board where air cannot reach the components on its surface. Since the major heat-producing and heat-sensitive components, such as the CPU and I/O devices, are located on the master printed circuit board, the stagnation regions may cause heat build-up resulting in the destruction of devices. A key component of the present invention is mounting the add-on boards vertically rather than horizontally to prevent the formation of stagnation regions.

The cabinet sits on legs or braces so that air can flow beneath the cabinet and through openings in the bottom surface of the enclosure. Natural convection draws the air through the bottom openings and openings toward the bottom of the front surface of the enclosure and out openings along the top edge of the back and side surfaces of the enclosure. This air flow in combination with the heat sink cools the power supply and the printed circuit boards.

BRIEF DESCRIPTION OF THE DRAWINGS

In the following drawings forming a material part of this description, there is shown.

DESCRIPTION OF THE PREFERRED EMBODIMENTS

Figure 1:
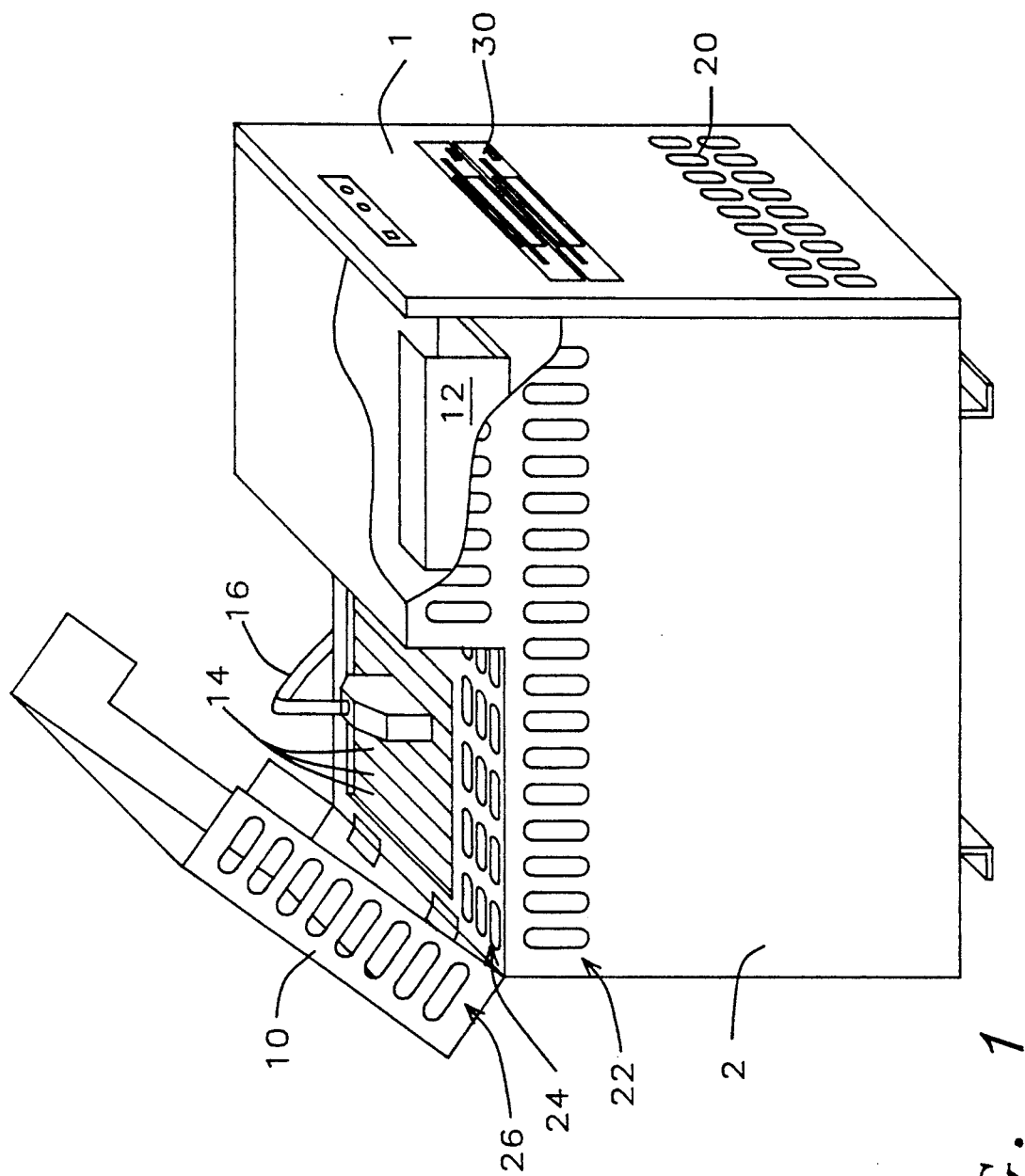
FIG. 1 obliquely illustrates the front, top, and one side of the electronic component cabinet showing the access panel in the open position.

Referring now more particularly to FIG. 1, there is illustrated the front panel 2 and side panel 1. A cutaway shows the heat sink 12 located at the top of the enclosure toward the front. The access panel 10 is illustrated in the open position. The edges of the printed circuit boards 14 can be seen through the access opening. A cable connector 16 is illustrated. The access panel cover has a cutout to allow for the easy cable connections. The access panel 10 has a short vertical front wall with openings 26, a short vertical side wall, and a short vertical rear wall with an opening for allowing passage of cables 18 and 19.

The cabinet is made of metal. The cabinet sits on legs 34 which may be plastic or bent metal strips. Air inlet openings 20 are used to cool the disk drives 30. Side vents 22, top vents 24 inside the access panel and side vents 26 on the access panel cover are air outlet vents.

Figure 2:
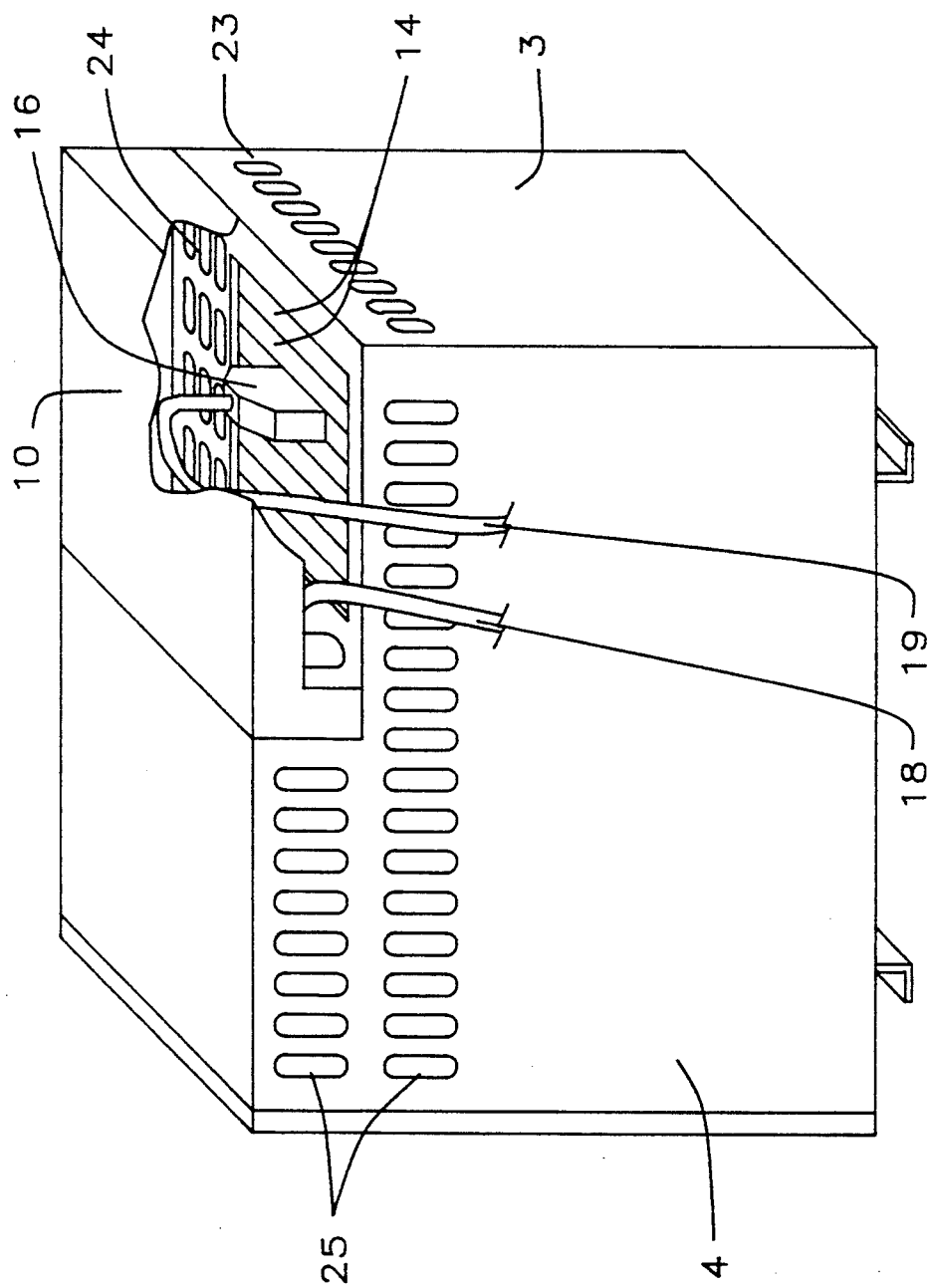
FIG. 2 obliquely illustrates the back, top, and second side of the cabinet showing the access panel in the closed position and showing a portion of the interior of the cabinet under the access panel.

Referring now to FIG. 2, there is illustrated the back 4 and remaining side 3 of the enclosure. In this figure, the access panel cover 10 is closed. A cutaway shows the edges of the printed circuit boards 14 and a cable connector 16. An input/output cable 19 and keyboard cable 18 are shown. Openings 23, 24, and 25 are air outlet vents.

About 220 Watts of heat can be dissipated with the present invention. The present invention can be used if $$\text{the Heat Concentration} = \frac{\text{Estimated Power Dissipation}}{\text{Internal Volume of Package}}$$

is less than 0.10 watts/inch$^3$.

The total area of vent openings can be computed based on the power to be dissipated and the temperatures involved, as in *The Handbook of Electronics Packaging Design and Engineering* by Bernard S. Matisoff, Published by VAn Nostrand Reinhold Company, pp. 150-155.

There are many conflicting requirements in determining the size of the vent openings. For example, for reduction of electromagnetic interference, the openings cannot be larger than L/20, where L=wavelength of the electromagnetic wave (FCC standard). The article, "Designing Ventilation Grilles for Electronic Equipment," by Theodore B. Hill and Jeffrey Lind, *Machine Design*, Aug. 9, 1990, pp. 73-77, explain these details.

In the present invention, the preferred vent openings are holes or slender slots. The desired ratio of inlet to outlet vent area is 1:1 or 1:1.2.

Figure 3:
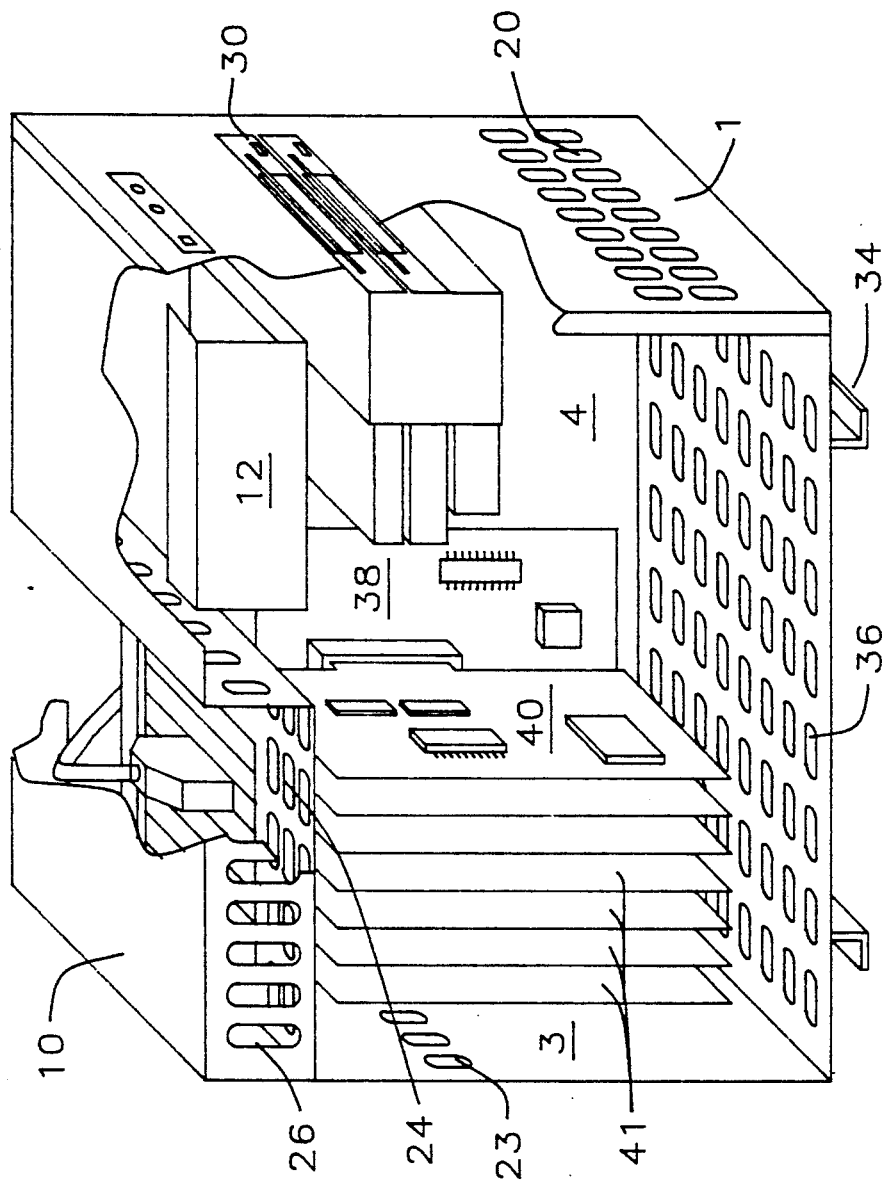
FIG. 3 obliquely illustrates the interior of the cabinet in the first preferred embodiment.

Referring now to FIG. 3, there is shown the inside cavity of the enclosure with side 2 removed for illustration purposes. The master printed circuit board 38 is mounted toward the back of side 4 of the enclosure. Other add-on printed circuit boards 40 and 41 are mounted vertically and perpendicularly to the master board 38. Alternatively, printed circuit board 38 can be a communication board. In this case, 40 is a CPU board which is positioned parallel to the add-on boards 41. Additional printed circuit boards can be added by opening side 2 and inserting the boards. Connectors or I/O cables can be added to the add-on printed circuit boards by lifting the access panel cover 10.

The cabinet sits on legs 34 to allow for air to flow from the bottom of the enclosure. Air flows through the bottom vents 36, past the printed circuit boards 38 and 40 and through the outlet vents 23, 24, and 26 as well as top vents on sides 2 and 4, not illustrated. Air also flows through the bottom vents 36, past the heat sink 12, and through the top vents on sides 2 and 4, not illustrated. Air drawn through vents 20 flows past the disk drives 30 and out the top vents on sides 2 and 4, not illustrated.

There are no openings on the top surface of the cabinet so that dust and water cannot get into the enclosure.

Figure 4:
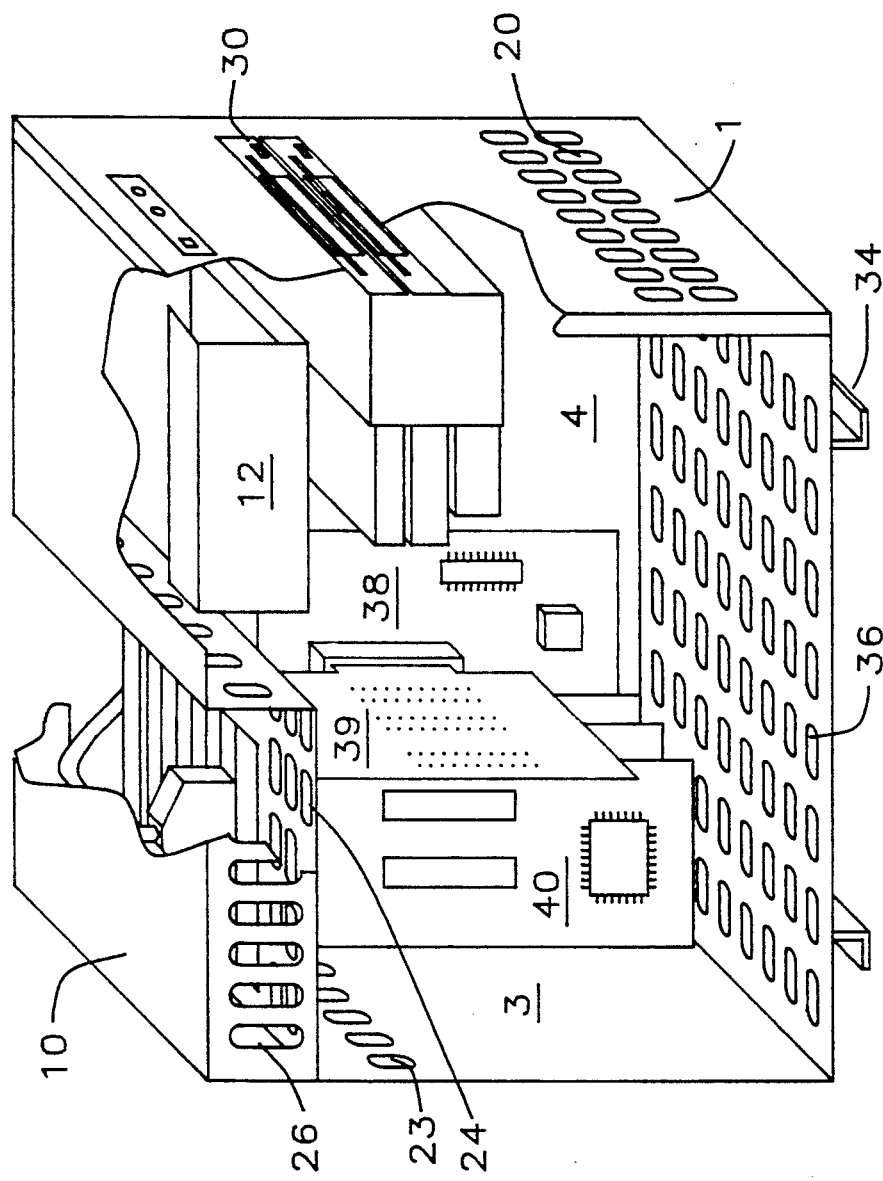
FIG. 4 obliquely illustrates the interior of the cabinet in the second preferred embodiment.

Referring now to FIG. 4, there is shown the same inside cavity as in FIG. 3, but for a second preferred embodiment in which an extension board 39 is mounted perpendicularly to the master printed circuit board 38. Additional printed circuit boards 40 are attached vertically and perpendicularly to the extension board 39.

Figure 5:
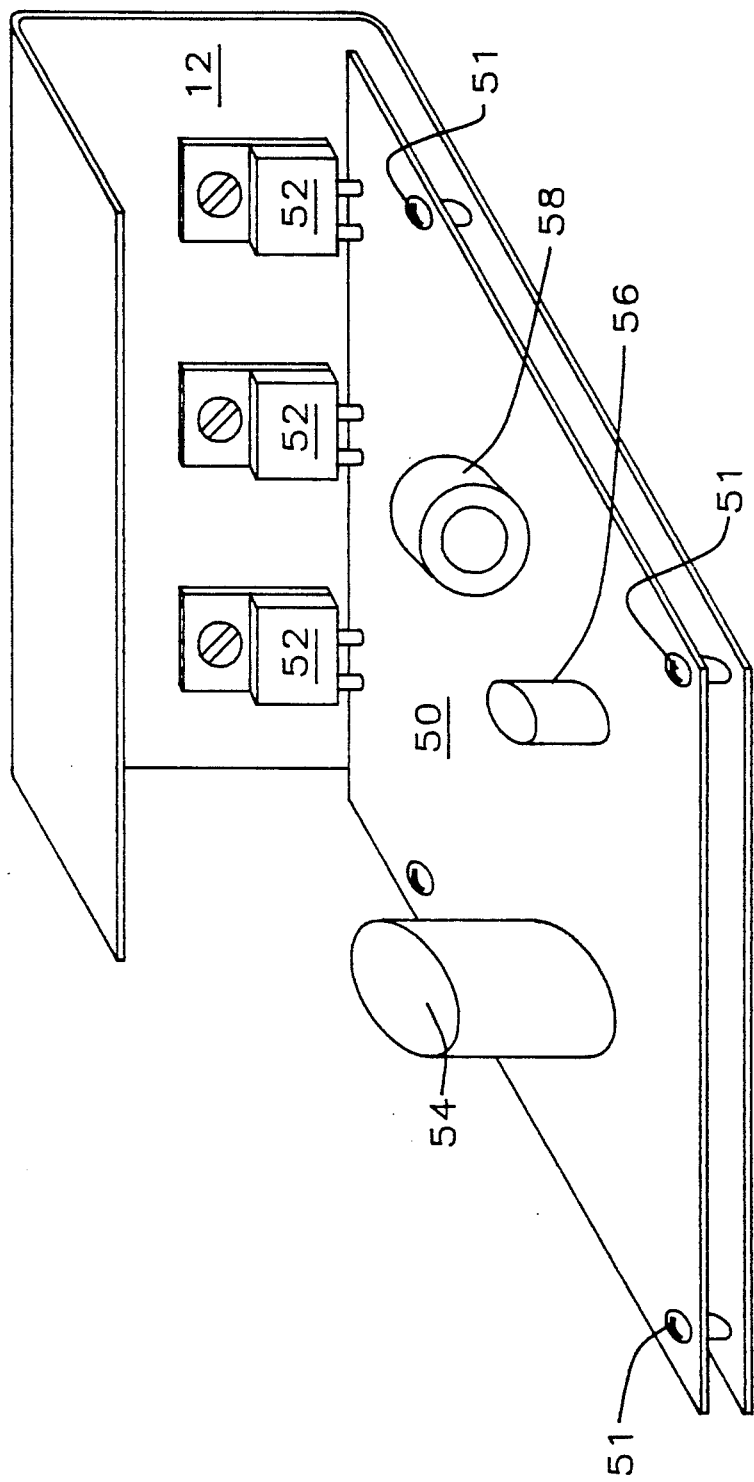
FIG. 5 obliquely illustrates the heat sink around the major heat-producing electronic components.

Referring now to FIG. 5, there is illustrated the heat sink 12 for the power supply supported within the enclosure. The printed circuit board 50 is attached to the heat sink 12 with screws 51. Space should be left between printed circuit board 50 and the heat sink 12 so that the electronic components' pins do not make contact with the heat sink. Power transistors 52 are mounted on the vertical portion of the heat sink 12. Other heat-generating components such as capacitors 54 and 56 and transformer 58 may be mounted on the printed circuit board 50.

The heat sink is composed of aluminum, copper, iron, or other high conductivity metal. It should be noted that the heat sink may be of a different structure than that illustrated in FIG. 5, such as in the form of a box. Typically, about 30% of the energy from a power supply dissipates as heat. Therefore, the heat sink should be able to handle about 30% of the energy (as heat in watts, approximately 50 watts) of the power supply.

Some components on the master printed circuit board also should be attached to (or enclosed by) heat sinks.

The fanless natural convection unit of the present invention has been built and tested.

TEST ENVIRONMENT

Software: QAPLUS.
Hardware: one forced convection system and one natural convection system (the present invention), each including:
PC-386/33 (64 cache, 8MB RAM)
HDD 80MB, AT bus card
FDD 5¼", 3½"
EMS card
VGA card
ethernet card
RS-232 card
GPIB card.

TEST CONDITIONS

The two units were turned on and remained on for 14 days continually. The temperature of the environment was 25° C. At the end of the test period, the temperatures of ten temperature-critical components were measured by infrared.

TEST RESULTS

The temperature of the hottest spot was 69.7° C. for the forced convection system and 63.8° C. for the natural convection system of the present invention. In addition, the variation of temperature over the components was reduced for the natural convection system of the present invention indicating that the system of the present invention is more thermal-homogeneous.

There are two effects of temperature on system performance: 1) the temperature of the individual components and 2) the temperature variation among components. As indicated in the aforementioned article, "Designing Ventilation Grilles for Electronic Equipment," every 10°-15° C. rise in junction temperature of a typical semiconductor doubles the failure rate of that component. It is estimated that variation of 1° C. between components will bring about a propagation delay of 10-100 pico ($10^{-12}$) seconds. The testing of the natural convection system of the present invention show an advantage of this system over the forced convection system in both individual temperature and temperature variation measurements.

While the invention has been particularly shown and described with reference to the preferred embodiments thereof, it will be understood by those skilled in the art that various changes in form and details may be made without departing from the spirit and scope of the invention.

What is claimed is:

1. A fanless convection cooling system which houses electronic components and major heat producing electronic components comprising:

a housing which defines a cavity and which includes a horizontal top surface, a vertical front surface, vertical side surfaces, a vertical rear surface, a horizontal bottom surface, and an opening panel, to gain access to said cavity;

a master printed circuit board attached vertically to one of said vertical surfaces of said housing;

additional printed circuit boards mounted vertically and perpendicular to said master printed circuit board;

openings in said horizontal bottom surface and in said vertical side surfaces of said housing through which cool air is drawn into the housing to carry away heat produced by said electronic components and said major heat producing electronic components; and openings in the top of at least one of said vertical side surfaces and in said vertical rear surface of said housing through which heated air produced by said electronic components and major heat producing electronic components is allowed to escape;

said opening panel to said cavity is a hinged cover located above said printed circuit boards and constitutes a part of said top surface;

said opening panel including a short vertical rear wall, a short vertical front wall, and a short vertical side wall.

2. The structure of claim 1 wherein there is a heat sink to which are attached said major heat producing electronic components producing the most heat.

3. The structure of claim 2 wherein said heat sink is composed of aluminum, copper, iron, or other high conductivity metal to which are attached said major heat producing electronic components.

4. The structure of claim 2 wherein said major heat producing electronic components include power transistors.

5. The structure of claim 2 wherein said heat sink is located at the inner top of and supported on a vertical surface of said housing.

6. The structure of claim 1 wherein said hinged cover provides room for cable connectors to said printed circuit boards.

7. The structure of claim 1 wherein said housing is constructed of metal.

8. The structure of claim 1 wherein said housing is supported on legs or braces so that air can flow through said openings in said horizontal bottom surface of the housing into the cavity.

9. The structure of claim 1 wherein the preferred proportion of said openings in said horizontal on the bottom surface of said housing to openings near the top of said housing is 80-100%.

10. A fanless convection cooling system which houses electronic components and the major heat producing electronic components comprising:

a housing which defines a cavity and which includes a horizontal top surface, a vertical front surface, vertical side surfaces, a vertical rear surface, a horizontal bottom surface, and an opening panel to gain access to said cavity;

a master printed circuit board attached vertically to one of said vertical surfaces of said housing;

an extension board attached vertically and perpendicular to said master printed circuit board;

additional printed circuit boards mounted vertically and perpendicular to said extension board and parallel to said master printed circuit board;

openings in said horizontal bottom surface and in at least one vertical side surface of said housing through which cool air is drawn to carry away heat produced by said electronic components and said major heat producing electronic components; and openings in the tops top of at least one of said vertical side surfaces and in said vertical rear surface of said housing through which heated air produced by said major heat producing electronic components is allowed to escape said housing;

said opening panel, to said cavity is a hinged cover located above said printed circuit boards and constitutes a part of said top surface;

said opening panel including a short vertical rear wall, a short vertical front wall, and a short vertical side wall.

11. The structure of claim 10 wherein there is a heat sink to which are attached said major heat producing electronic components.

12. The structure of claim 11 wherein said heat sink is composed of aluminum, copper, iron, or other high conductivity metal to which are attached said major heat producing electronic components.

13. The structure of claim 11 wherein said major heat producing electronic components include power transistors.

14. The structure of claim 11 wherein said heat sink is located at the inner top of and supported on at least on of said vertical surfaces of said housing.

15. The structure of claim 10 wherein said hinged cover provides room for cable connectors to said printed circuit boards.

16. The structure of claim 10 wherein said housing is constructed of metal.

17. The structure of claim 10 wherein said housing is supported on legs or braces so that air can flow through said openings in said horizontal bottom surface of the housing into the cavity.

18. The structure of claim 10 wherein the preferred proportion of openings in said horizontal bottom surface of said housing to openings near the top of said housing is 80-100%.

* * * * *